United States Patent [19]

Arnould et al.

[11] Patent Number: 4,520,552
[45] Date of Patent: Jun. 4, 1985

[54] SEMICONDUCTOR DEVICE WITH DEEP GRIP ACCESSIBLE VIA THE SURFACE AND PROCESS FOR MANUFACTURING SAME

[75] Inventors: Jacques Arnould; Eugène Tonnel, both of Paris, France

[73] Assignee: Thomson-CSF, Paris, France

[21] Appl. No.: 571,095

[22] Filed: Jan. 16, 1984

Related U.S. Application Data

[62] Division of Ser. No. 253,263, Apr. 13, 1981, abandoned.

[30] Foreign Application Priority Data

Apr. 14, 1980 [FR] France .............................. 80 08270

[51] Int. Cl.³ ..................... H01L 29/80; H01L 27/02; H01L 21/76
[52] U.S. Cl. .................................. 29/571; 29/577 R; 29/578; 29/580; 29/576 W; 148/1.5; 148/187; 148/188; 357/41; 357/49; 357/55; 357/59; 156/644; 156/643; 156/646
[58] Field of Search ................. 29/571, 580, 583, 577, 29/578, 576 W; 148/1.5, 187, 188; 357/55, 41, 49, 59, 55, 56, 50; 156/644, 643, 646, 650

[56] References Cited

U.S. PATENT DOCUMENTS 4,353,086 10/1982 Jaccodine et al. ................ 357/59 X

FOREIGN PATENT DOCUMENTS 68582 6/1978 Japan ............................... 357/22 U
147469 12/1978 Japan ..................................... 357/55

Primary Examiner—Brian E. Hearn
Assistant Examiner—David A. Hey
Attorney, Agent, or Firm—Cushman, Darby and Cushman

[57] ABSTRACT

A semiconductor device with deep grid accessible via the surface having a silicon substrate and comprising U-shaped grooves. The upper parts of the side walls of these grooves are insulated by a silica layer and the lower parts of these grooves connect up with overdoped zones. Polycrystalline silicon provides ohmic contact between selected positions on the upper face of the transistor and the grid layer.

3 Claims, 12 Drawing Figures

SEMICONDUCTOR DEVICE WITH DEEP GRIP ACCESSIBLE VIA THE SURFACE AND PROCESS FOR MANUFACTURING SAME

This is a division, of application Ser. No. 253,263, filed Apr. 13, 1981; abandoned.

BACKGROUND OF THE INVENTION

The present invention relates to semiconductor structures with deep localized grid accessible via the surface and a process for manufacturing same.

In different types of discrete or integrated semiconductor components, such as high-power bipolar transistors, gate turn-off thyristors, junction power vertical field-effect transistors and others, there is a deep localized layer in the form of a grid disposed inside the semiconductor wafer in a plane parallel to that of the principal faces of this wafer.

Such deep layers are currently designated in the technique by the expression buried grids because of the conventional manufacturing process of the prior art by which they were obtained. In fact, starting from a semiconductor substrate, this process included implanting therein dopant atoms according to the type of conductivity corresponding to that of the grid which it was desired to obtain, then in forming above this substrate one or more epitaxial layers in which one or more diffusions are possibly formed. Such a structure is shown schematically in the accompanying FIG. 1. There can be seen therein the substrate 1 overlaid by an epitaxial layer 2 in which is formed a diffused zone 3. The buried layer or grid 4 is present at the limit between substrate 1 and the epitaxial layer 2. Then, a contact is provided between the upper surface of the semiconductor wafer and the buried grid 4 by means of a deep diffusion 5. In numerous practical applications, grid 4 must have an extremely fine and well-defined pitch. Furthermore, this grid serves generally for turning off the semiconductor device. It is then necessary for the transverse resistivity of the grid layer to be as low as possible. Its doping level must then be very high. The high doping level makes it difficult to control with great accuracy the extent of the diffusion from the initially implanted layer so that the mesh of the grid do not close and have a predetermined thickness. The control of this diffusion is very delicate to achieve particularly because of the other thermal diffusion steps which must be provided for the formation of the other layers formed on the substrate. Parasite diffusions of the implanted dopant may also occur during formation of the epitaxial layer.

These drawbacks are all the more noticeable since, in numerous devices, attempts have been made to obtain in a practical way grid mesh dimensions of the order of a few microns. Moreover, because of the very fact of using an epitaxial layer deposited on a substrate, there cannot develop between the mesh of the grid, at the level of the interface between the epitaxial layer and the substrate, a space charge required for the proper operation of the device.

Thus, an object of the present invention is to provide a novel deep-grid semiconductor device structure which palliates the structural or manufacturing drawbacks of the buried-grid devices of the prior art.

Another object of the present invention is to provide a novel process for manufacturing a deep-grid semiconductor device.

To attain these objects as well as others, the present invention provides a deep-grid semiconductor device structure not comprising a layer buried under an epitaxial layer in accordance with the technique which has been adopted during these latter years.

SUMMARY OF THE INVENTION

Thus, the present invention provides a semiconductor device structure, comprising a semiconductor body having different layers with distinct types of conductivity and/or doping levels, a first face comprising grooves, the lateral walls of the grooves being coated with an insulating agent over at least a part of their height from their outcropping on the first face, in which the bottom and the noninsulated parts of the lateral walls of the grooves are in contact with a deep layer and are possibly surrounded by a zone of specific selected type of conductivity and doping level and in which the grooves are filled with a conducting material. The outcropping zone of the conducting material at the surface of the groove may be covered with an insulating layer except for the positions where it is desired to make contact with the conducting material. Thus a structure can be obtained in which a first principal electrode corresponding to the nongrooved parts of the first face and the grid electrode are at the same plane level, which allows great simplicity in forming the contact and metalization.

In a particular embodiment, the semiconductor substrate from which the device of the present invention is formed is made from silicon, the agent for insulating the lateral upper part of the grooves is silica and the conducting material for providing the contact with the deep zone is heavily doped polycrystalline silicon; this polycrystalline silicon may serve as a diffusion source for doping the semiconductor body in the vicinity of the bottom and the noninsulated lateral part of the grooves.

The present invention is simply implemented on a silicon substrate.

In this case, a specific process for manufacturing a device in accordance with the present invention from a silicon body comprising different layers with distinct conductivity type and/or doping level comprises the following steps: coating the upper face with a layer of silicon nitride; opening windows in the silicon nitride and carrying out anisotropic etching to form U-shaped grooves in a checkered pattern; oxidizing the walls of the grooves; removing the oxide layer at the bottom of the grooves; possibly carrying out complementary anisotropic etching to deepen the grooves; filling the grooves with heavily doped polycrystalline silicon; carrying out a thermal step for causing the dopant to diffuse in the substrate under the position of the groove nonprotected by the silica and oxidizing, so as to change into silica the upper surface of the polycrystalline silicon; selectively removing the silicon nitride layer; opening windows at selected positions in the silica layer to cause contact zones to appear on the polycrystalline silicon filling and grooves; depositing a metalization; etching the metalization to separate a principal electrode in contact with the first face and an electrode in contact with the polycrystalline silicon, i.e. the grid.

The step for removing the silica layer at the bottom of the U-shaped grooves may be carried out by etching the bottom of the grooves by ionic bombardments, e.g. with argon or boron, and by selectively etching this silica layer having undergone implantation by means of an appropriate etching product, for example a mixture of hydrofluoric acid and ammonium fluoride.

DESCRIPTION OF THE DRAWINGS

These objects, characteristics and advantages as well as others of the present invention will be discussed in more detail in the following description of particular embodiments made with reference to the accompanying figures in which:

FIGS. 2 and 3 show partial longitudinal and cross-sectional views of embodiments of a device in accordance with the present invention.

DESCRIPTION OF THE PREFERRED EMBODIMENTS

Figure 1:
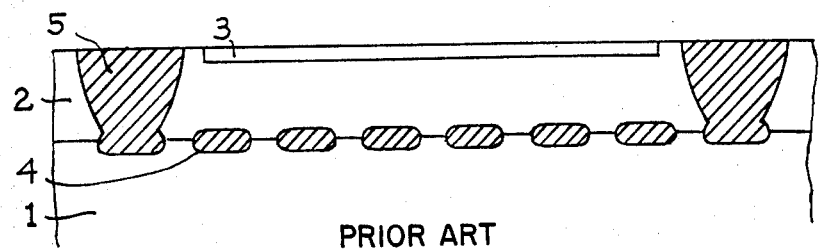
FIG. 1 which has been described above was for recalling the state of the technique.

This device comprises a semiconductor body having for example junctions 11 and 12 between semiconductor layers of distinct type and/or doping level. Projecting zones 14 are defined by grooves 15. The upper part of the lateral wall of these grooves is coated with a layer of an insulating material 16; the bottom of the grooves as well as the parts of the lateral walls noninsulated by layer 16 are possibly surrounded by a zone 17 having selected doping level and conductivity type. The inside of the furrows or grooves 15 is filled with an electrically conducting product providing an ohmic contact with zones 17 or a direct contact, ohmic or not, with the bottom of the groove if zones 17 do not exist so as to serve as electric conducting layer between an electrode 18 on the upper face of the semiconductor body and the layers or zones in contact with the bottom of the groove. A second electrode 20 provides electric contact with the nongrooved part of the upper face.

In a particular embodiment of the present invention, the upper part of the conducting product 15 filling the grooves is insulated by an insulating layer 19 and only a few windows 21 are provided in this insulating layer 19 to ensure contact between metalization 18 and the conducting product filling each groove. Thus metal layer 20 in contact with the upper face may be continuous, avoiding the necessity of providing apertures in this metalization layer opposite each one of the grooves.

Thus a deep-grid structure may be obtained presenting, with respect to the buried-grid structures of the prior art, numerous structural advantages resulting particularly from the fact that: the diffused zone 17 is clearly defined by the laterally insulated part 16 of the groove; the principal electrode contacts on the upper face and the grid electrode contacts are brought into the same plane and their formation may be simplified; finally and especially as will be discussed hereafter, in relation with a specific example, the structure of the present invention may be produced in a simple way while obtaining extreme miniaturization of the different dimensions.

Figure 4:
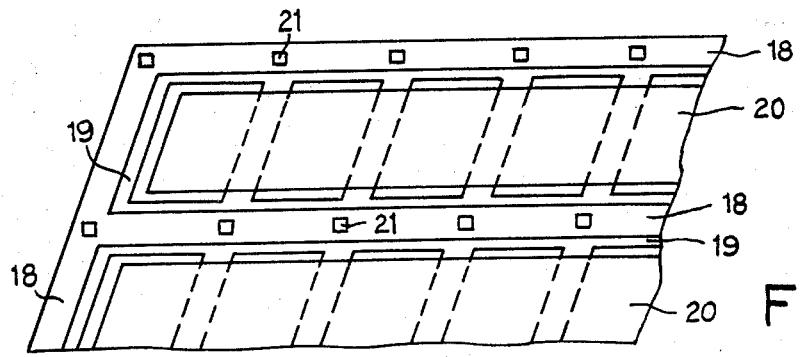
FIG. 4 shows a top view of same.

In the particular case where the semiconductor substrate 10 is a silicon substrate, this latter will be selected according to an orientation (1, 1, 0). Grooves 15 are formed in the substrate by anisotropic etching. The etchings form preferably, as shown in the top view of FIG. 4, parallelograms with angles of 70° and 110°. The insulating material 16 for the grooves is preferably silica, the conducting material for filling these grooves 15 is preferably doped polycrystalline silicon and the grid zone 17 is preferably a diffused zone obtained by diffusion in the substrate of dopant atoms initially contained in the polycrystalline silicon. Metalizations 18 and 20 are preferably aluminium metalizations. By way of example, a practical device with parallelepipedic grid may be formed with the following dimensional characteristics:

total depth of the grooves: 5 to 50 microns
distance between grooves: 10 to 15 microns
width of grooves: 3 to 5 microns
width or depth of layer 17: 2 to 3 microns
length of the grooves: 0.5 to 1 mm In the case where the device might have the digitated configuration shown in a top view in FIG. 4, the metalization finger intended to make contact with openings 21 at several points of the grid may have a width of the order of 30 to 50 microns.

Figure 2:
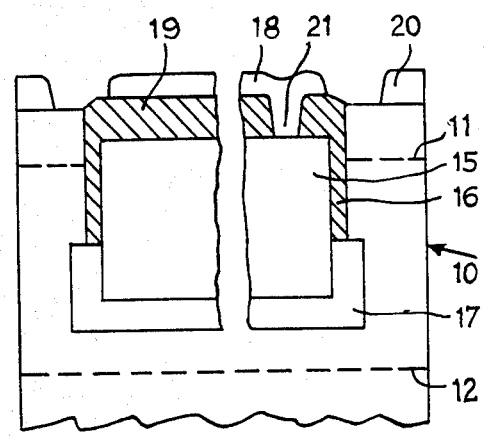
FIGS. 2 and 3 are sectional views of embodiments of a deep-grid device in accordance with the invention, taken in different planes.
Figure 3:
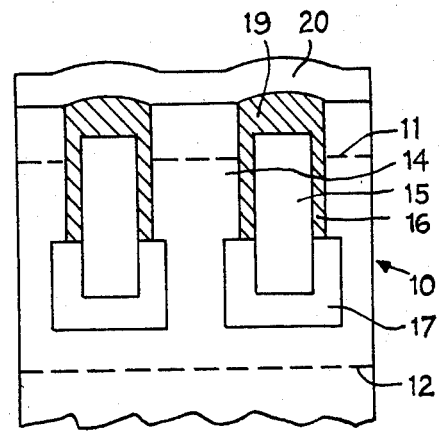

A process for manufacturing a structure such as shown in FIGS. 2 to 4 formed on a silicon substrate (1, 1, 0) will now be described in detail with reference to FIGS. 5 to 10.

Figure 5:
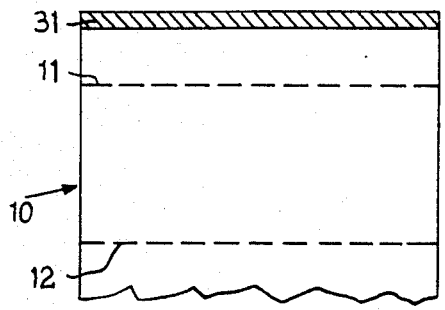
FIGS. 5 to 10 illustrate steps for manufacturing a device in accordance with the invention.

FIG. 5 shows a silicon body 10 comprising junctions 11 and 12, on the first face or upper face of which there is formed a protecting layer 31 made from silicon nitride ($Si_3N_4$). Apertures are formed at selected positions in the silicon nitride layer, for example in conformity with the parallelogram checkered pattern shown in a top view in FIG. 4. These apertures in the silicon nitride layer serve as an etching mask for carrying out anisotropic etching of the wafer and for providing the U-shaped grooves 32 shown in FIG. 6. The edges of the apertures are aligned in the directions (2, 1, 1) and the lateral faces are formed by planes (1, 1, 1). A thermal heating step in an oxidizing atmosphere enables the walls of the grooves to be oxidized so as to form a silica ($SiO_2$) insulating layer 16.

Then implantation of ions, of argon or boron for example, is carried out with an incidence perpendicular to the surface of the wafer so as to provide this implantation in the silica layer at the bottom of grooves 32. It is then possible to selectively etch, by means of an appropriately proportioned etching product, the bottom of the grooves which has received the implantation without etching the walls of these grooves nor the nitride layer at the surface of the wafer.

Figure 7:
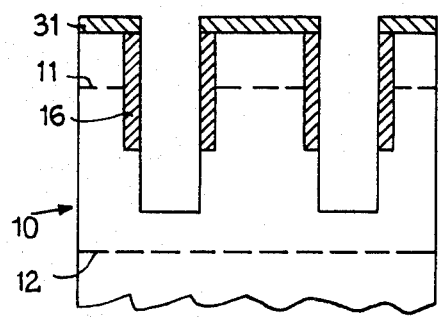
Figure 8:
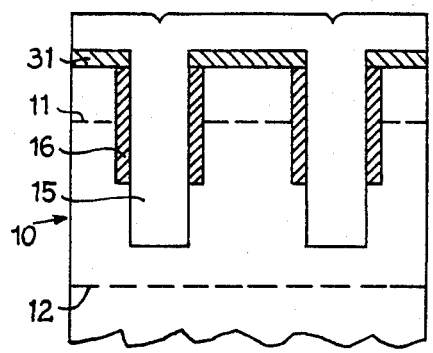

As shown schematically in FIG. 7, after this removal of the oxide layer at the bottom of the grooves, complementary anisotropic etching may be carried out to deepen these furrows or grooves which still maintain nevertheless their U-shape. Thus grooves are obtained whose upper part is insulated by the silica layer 16 and whose deepest part penetrates without an intermediate layer into the silicon of the substrate. If complementary etching is not carried out, only the bottom of the grooves lets the silicon of the substrate appear. The groove is then filled with doped polycrystalline silicon 15, for example of P+ type (boron) by means of techniques existing at present for effecting such deposits at relatively low temperatures (less than 600° C.).

Figure 9:
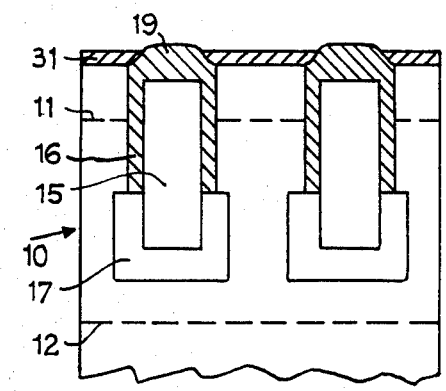

As shown in FIG. 9, the excess polycrystalline silicon on the upper face of the device is removed by an appropriate etching product, for example by plasma etching, and a heating step is carried out to provide a silica layer 19 at the upper part of the grooves and also to ensure diffusion of the dopant atoms contained in the polycrystalline silicon 15 (for example of boron) towards the substrate so as to form zones 17. It will nevertheless be noted that for certain devices it is not necessary to form zones 17.

Figure 10:
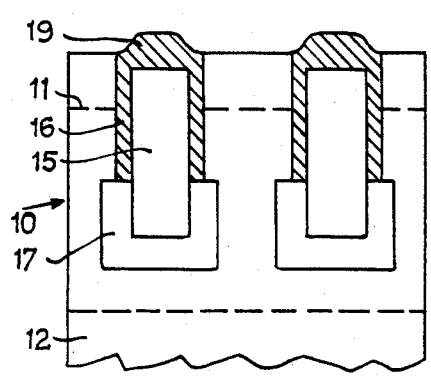

During the step shown in FIG. 10 the silicon nitride layer 31 is removed. After which contact apertures are formed in silica layer 19 then the upper and lower faces of the device are metalized, for example with aluminium. The aluminium layer on the upper face is etched to separate the principal electrode from the grid electrode in contact with the polycrystalline silicon 15 at the positions defined by the windows opened in the oxide layer 19. Thus a device in accordance with the invention is obtained such as shown in FIGS. 2 to 4.

According to one of the advantages of the present invention, the step for forming the grid layer properly speaking 17 is one of the last steps of the manufacturing process and is followed by no other diffusion step, i.e. by no appreciable heating. Thus, the depth or thickness of zone 17 from the groove may be controlled with great accuracy. The phenomena of exodiffusion are thus avoided which make so difficult technologically the formation of very-fine-pitch buried-grid structures of the type shown in FIG. 1.

Figure 6:
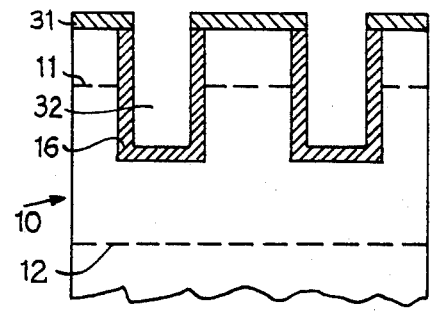

Of course, the manufacturing process of the present invention is susceptible of numerous variations, for example insofar as the etching of the oxide layer in the grooves illustrated in FIG. 6 and the process for forming layer 17 are concerned. This latter could also be formed from a dopant implanted or diffused from the structure in the state shown in FIG. 7, the polycrystalline silicon 15 for filling the grooves being disposed subsequently. This allows independent control of the diffusion of the P+ junction and of the transverse conductivity of the grid by filling with P+ type polycrystalline silicon 15. According to a variation of the present invention, the conducting material filling the grooves, instead of being polycrystalline silicon, may be a compound of silicon and a refractory metal such as platinum, tungsten or molybdenum, which provides a conducting material of lower resistivity than polycrystalline silicon. In the case where such a compound of silicon and refractory metal is used, if it is desired to provide layers 17, previous implantation of these layers is carried out. It will be noted that an advantage of a silicon+refractory metal compound is that it may oxidize on the surface like polycrystalline silicon. There is then a tendency, during an oxidizing step, for a separation to occur between the silicon and the refractory metal, the silicon transformed into silica appearing at the periphery in the oxidized zones, which further improves the resistivity. It will also be noted that the present invention, even in the case of a silicon substrate, is not limited to the formation of grooves by anisotropic etching. Techniques are now known for forming deep grooves of very small width by ionic etching. Depending on technical and economic considerations, this method for forming the grooves may be preferred or any other known method.

EXAMPLES OF APPLICATION OF THE PRESENT INVENTION manufacture of buried-base-grid high-power transistors.

Figure 11:
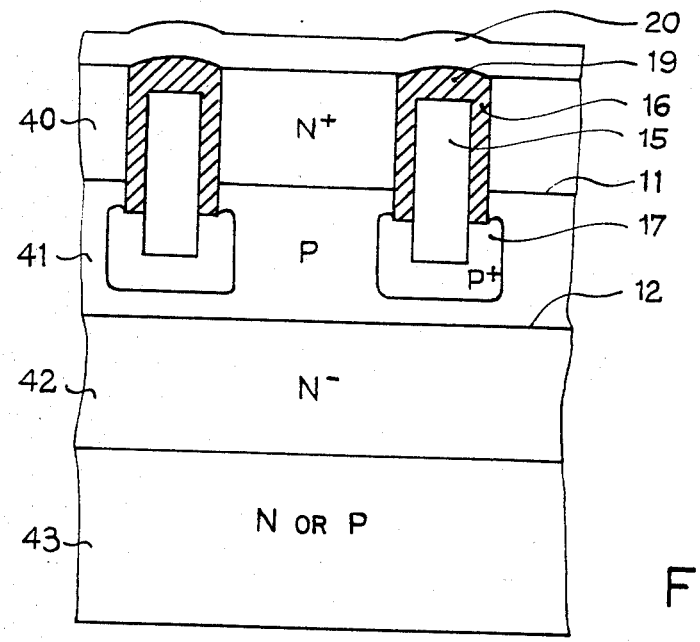
FIGS. 11 and 12 illustrate applications of the present invention.

As shown in FIG. 11, these transistors comprise an N+ type emitter 40 on a P type base 41 and on a collector formed from an N-type layer 42 then an N+ type surface layer 43. It is then desired to form a base grid with high P+ doping level inside the P type base or to make direct contact with different positions of the base layer. The grooves in accordance with the present invention are then formed so that their bottom opens into the P type base layer 41. Multiple base contacts may then be simply formed by not providing P+ type diffused zones 17 or else a deep grid with high doping level may be effectively formed by forming diffused zones 17.

manufacture of gate turn-off thyristors.

These thyristors have a structure similar to that of the transistors shown in FIG. 11 except that layer 43 is then a P type layer and not an N type layer.

manufacture of vertical-type junction field-effect transistors.

Figure 12:
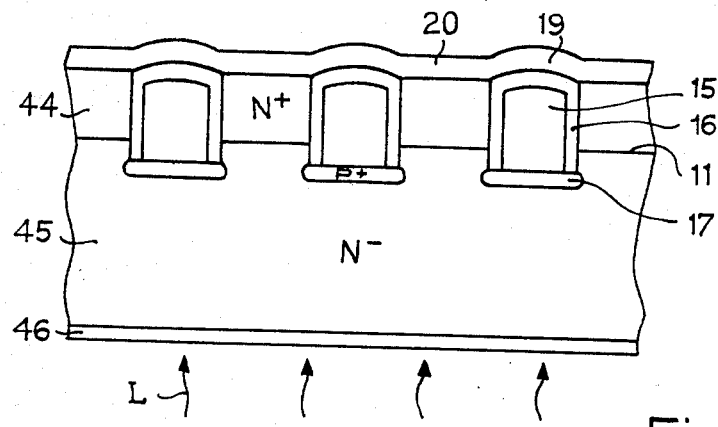

These structures comprise an N type substrate inside which is formed a P+ type grid.

manufacture of horizontal multijunction solar cells (FIG. 12).

This cell or diode array comprises an N+ type layer 44 on an N-type substrate 45. The lower face of the substrate is coated with an anti-reflection layer 46 which receives a concentrated incident light beam L. In this application, the grooves are formed in a single step and extend through N+ type layer 44 to penetrate into the N-type layer 45. The bottom of the grooves rests on a P+ type layerm 17 formed for example, as was mentioned above, from P+ type doped polycrystalline silicon 15 filling the grooves. There may also be provided, as has been indicated by way of variation of the invention, that the P+ type zones 17 are formed by implantation at the bottom of the grooves before filling thereof by means of the conducting material 15. With respect to a conventional MJH (multijunction horizontal) structure, the structure of the present invention presents, on the one hand, the advantage of greater compactness, since, in a conventional structure, the adjacent N+ and P+ zones must be separated by a low doping level zone which corresponds to lost space. Furthermore, the formation in the way described above of the insulating layer 19 at the limit between conducting layer 15 filling the grooves and metalization 20 covering the diode allows a large-size metalization to be used in contact with all the N+ zones and capable of being mounted on a heat-sink, the contacts with the grooves being able to be made at an edge or at the periphery of the solar cell.

Of course the present invention is susceptible of other applications, particularly the word grid such as it is used in the present description and in the following claims must be understood in a general way as possibly designating a deep limited zone in a semiconductor body having a shape other than a checkered pattern, for example a ring or even an assembly of separate zones.

In fact, insofar as this latter application and the preceding ones are concerned, it will be noted that an advantage of the present invention resides in the fact that the process described allows a deep layer to be reached by forming a groove occupying a minimum area on the semiconductor wafer whereas the tapping for contacting a deep layer formed by descending diffusion such as designated by reference 5 in FIG. 1 occupies an appreciably larger area on the semiconductor wafer. Furthermore, when using descending diffusion, attention must be paid to the disposition of the layers so that such descending diffusion does not cause short-circuits or parasite junctions between separate layers. On the contrary, by using the process of the present invention, because the grooves are insulated over at least a part of their lateral surface, any risk of short-circuiting with the layers met between the deep layer and the surface of the semiconductor wafer is avoided; the result is an overall simplification of the design of certain semiconductor devices.

Coming back to the figures, it should be emphasized that, in accordance with customary use in the field of representation of semiconductors, the different dimensions of the layers and structures has not been shown to scale, nor from one figure to another nor inside the same figure. Furthermore, insofar as FIGS. 2 to 4 are concerned, these figures do not correspond to views in different planes of the same embodiment. Starting with FIG. 4, which represents a checkered-pattern structure of grooves, FIG. 3 could correspond to a sectional view perpendicular to the great length of the grooves under electrode 20, and FIG. 4 shows, by way of example, how windows 21 might be disposed for allowing access to the grid with digited principal (20) and grid (18) electrodes. On the other hand, FIG. 2 shows a longitudinal sectional view of a single groove not belonging to a checkered pattern and grid metalization 18 and window 21 of this FIG. 2 do not correspond to the embodiment of FIG. 4.

The present invention is not limited to the embodiments which have been more explicitly described above; it includes the different variations and generalizations thereof included in the field of the accompanying claims.

What is claimed is:

1. A process for manufacturing a semiconductor device on a semiconductor substrate, the device including different layers of distinct conductivity type and/or doping levels, said device including an array of highly doped regions of a first conductivity type buried in a region of a second conductivity type opposite to the first type, said array being conductively connected to a metallization layer formed on a major surface of the substrate, said process comprising the following steps:
   coating said major surface of the substrate with a layer of a first protecting substance,
   selectively etching said first substance according to a predetermined pattern corresponding to said array to be formed,
   anisotropically etching the substrate where it is not covered by said first substance, to form vertical grooves having vertical lateral walls and a bottom wall, said grooves extending to a first depth from said major surface of the substrate,
   forming on the vertical walls and bottom wall of the grooves a coating of a second, electrically insulating, protecting substance,
   removing said second substance from the bottom wall of the grooves through an anisotropic etching process while keeping said second substance on the vertical walls, and keeping said first substance outside said grooves,
   deepening said grooves where they are not coated with said second protecting substance, by an anisotropic etching process, thereby vertically increasing the depth of the grooves to a depth greater than said first depth, and
   filling the grooves with a conductive material to make electrical contact at the bottom of the grooves between said conductive material and said semiconductor substrate, said conductive material being insulated from said substrate by said second protecting layer along the vertical walls of the grooves from the surface of the substrate down to said first depth.

2. A process according to claim 1, wherein said first substance is silicon nitride, said second substance is silicon oxide and said conductive material is polycrystalline silicon.

3. A process for manufacturing a semiconductor device on a semiconductor substrate including layers of distinct conductivity type and/or doping levels, said device including an array of grooves filled with conductive material contacting the semiconductor substrate at the bottom of the grooves, said process comprising the following steps:
   coating a major surface of the substrate with a layer of silicon nitride,
   selectively etching said layer of silicon nitride according to a predetermined pattern corresponding to said array to be formed,
   anisotropically etching the substrate where it is not covered by silicon nitride, to form vertical grooves having vertical lateral walls and a bottom wall,
   forming on the vertical walls of the grooves a coating of an insulating substance,
   removing said insulating substance from the bottom wall of the grooves through an anisotropic etching process while keeping said insulating substance on the vertical walls and while keeping said silicon nitride on the substance outside said grooves,
   filling the grooves with an oxidizable conductive material to make electrical contact between said conductive material and the substrate at the bottom of the grooves, said conductive material being insulated from said substrate by said insulating substance on the vertical walls of the grooves,
   removing any oxidizable conductive material outside said grooves by plasma etching,
   oxidizing an upper portion of said conductive material, oxidation of the substrate outside the grooves being prevented by said layer of silicon nitride,
   removing the silicon nitride layer,
   selectively etching the oxidized conductive material at selected places, and
   depositing and etching a metallization layer of which some portions contact the major surface of the substrate between the grooves and other portions contact the oxidizable conductive material at said selected places.

* * * * *